United States Patent
Terai et al.

(10) Patent No.: US 9,263,673 B2
(45) Date of Patent: Feb. 16, 2016

(54) RESISTIVE MEMORY DEVICE HAVING ASYMMETRIC DIODE STRUCTURE

(71) Applicant: SAMSUNG ELECTRONICS CO., LTD., Suwon-Si, Gyeonggi-Do (KR)

(72) Inventors: Masayuki Terai, Suwon-si (KR); In-Gyu Baek, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/609,452

(22) Filed: Jan. 30, 2015

(65) Prior Publication Data
US 2015/0372229 A1    Dec. 24, 2015

(30) Foreign Application Priority Data
Jun. 23, 2014  (KR) .................... 10-2014-0076772

(51) Int. Cl.
*H01L 45/00* (2006.01)
(52) U.S. Cl.
CPC ............ *H01L 45/1253* (2013.01); *H01L 45/12* (2013.01); *H01L 45/1233* (2013.01)
(58) Field of Classification Search
CPC ....... H01L 45/04; H01L 45/06; H01L 45/144; H01L 45/1233; H01L 27/24
USPC ........................................................ 257/2–4
See application file for complete search history.

(56) References Cited

U.S. PATENT DOCUMENTS

| 8,183,665 B2 * | 5/2012 | Bertin .................... B82Y 10/00 257/529 |
| 8,274,130 B2 | 9/2012 | Mihnea et al. |
| 2012/0145984 A1 | 6/2012 | Rabkin et al. |
| 2012/0302029 A1 | 11/2012 | Mihnea et al. |

FOREIGN PATENT DOCUMENTS

KR    1020120074187 A    7/2012

OTHER PUBLICATIONS

A 130.7mm2 2-layer 32Gb ReRAM memory device in 24nm technology published in Solid-State Circuits Conference Digest of Technical Papers (ISSCC), 2013 IEEE International on Feb. 17-21, 2013.
An access-transistor-free (0T/1R) non-volatile resistance random access memory (RRAM) using a novel threshold switching, self-rectifying chalcogenide device published in Electron Devices Meeting, 2003. IEDM '03 Technical Digest. IEEE International on Dec. 8-10, 2003.

* cited by examiner

*Primary Examiner* — Monica D Harrison
(74) *Attorney, Agent, or Firm* — Volentine & Whitt, PLLC

(57) ABSTRACT

A resistive memory device includes a switching device disposed on a lower interconnection, a resistor element disposed on the switching device, and an upper interconnection disposed on the resistor element. The switching device includes a diode electrode, a high-concentration lower anode disposed on the diode electrode, a middle-concentration lower anode disposed on the lower high-concentration anode electrode, a common cathode disposed on the middle-concentration lower anode, a low-concentration upper anode disposed on the common cathode, and an high-concentration upper anode disposed on the low-concentration upper anode. The peak dopant concentration of the middle-concentration lower anode is at least 10 times greater than the peak dopant concentration of the low-concentration upper anode.

20 Claims, 17 Drawing Sheets

RESISTIVE MEMORY DEVICE HAVING ASYMMETRIC DIODE STRUCTURE

PRIORITY STATEMENT

This application claims priority under 35 U.S.C. §119 to Korean Patent Application No. 10-2014-0076772 filed on Jun. 23, 2014, the disclosure of which is hereby incorporated by reference in its entirety.

BACKGROUND

1. Field

The inventive concept relates to a resistive memory device.

2. Description of Related Art

A resistive memory device, particularly, a ReRAM device, is a next generation memory device which can provide different resistances indicative of high and low logic states. The ReRAM device has been receiving attention because of its low cost per bit to manufacture, and more particularly, because of its usability as a non-volatile random access memory device. However, resistive memory devices, such a the ReRAM, include diodes. Therefore, leakage current which may lower the desired operating speed and lead to excessive power consumption is a concern in resistive memory devices.

SUMMARY

According to an aspect of the inventive concept, there is provided a resistive memory device comprising: a lower interconnection extending in a first direction, an upper interconnection extending in a second direction perpendicular to the first direction, and a memory cell disposed at a location at which the lower interconnection crosses the upper interconnection, and in which the memory cell includes a switching device, a lower electrode disposed on the switching device, a resistor disposed on the lower electrode, and an upper electrode disposed on the resistor, in which the switching device includes a lower diode having a lower cathode, and an upper diode disposed on the lower diode, and having an upper cathode, in which each of the upper cathode and the lower cathode comprise at least one layer of doped material, and in which the average dopant concentration of the upper cathode is greater than the average dopant concentration of the lower cathode.

According to another aspect of the inventive concept, there is provided a resistive memory device, comprising: a lower interconnection, a switching device disposed on the lower interconnection, a resistor element disposed on the switching device, and an upper interconnection disposed on the resistor element, and in which the switching device comprises a lower diode having a lower cathode and a lower anode, and an upper diode having an upper cathode and an upper anode, and in which the lower diode and the upper diode include dopants, and the distribution of the dopant concentration of the lower diode and the distribution of dopant concentration of the upper diode, each in a vertical direction, are asymmetric with respect to a horizontal plane disposed midway between the upper and lower diodes.

According to another aspect of the inventive concept, there is provided a memory device, comprising: a first line, a second line that crosses over the first line, and a switch and a resistor disposed in series between the first and second lines, and in which the switch includes a stack of electrode layers, and the electrode layers comprise first and second pairs of electrode layers which constitute an asymmetric diode structure. The electrode layers of the first pair are disposed symmetrically with respect to one another in the stack about a plane perpendicular to the direction in which the electrodes are stacked, and the electrode layers of the first pair are of the same type of material and contain the same type of dopant. The electrode layers of the second pair are disposed symmetrically with respect to one another in the stack about a plane perpendicular to the direction in which the electrodes are stacked, and the electrode layers of the second pair are of the same type of material and contain the same type of dopant. However, the average dopant concentrations of the electrode layers of the second pair are substantially different from one another, and the average dopant concentration of each of the electrode layers of the second pair is each substantially lower than the average dopant concentration of each of the electrode layers of the first pair. Furthermore, the electrode layers constitute a lower diode and an upper diode of the diode structure.

BRIEF DESCRIPTION OF THE DRAWINGS

The foregoing and other features and advantages of the inventive concepts will be apparent from the more detailed descriptions of preferred embodiments of the inventive concepts, as illustrated in the accompanying drawings. The drawings are not necessarily to scale, emphasis instead being placed upon illustrating the principles of the inventive concepts. In the drawings.

DETAILED DESCRIPTION OF THE PREFERRED EMBODIMENTS

Figure 1A:
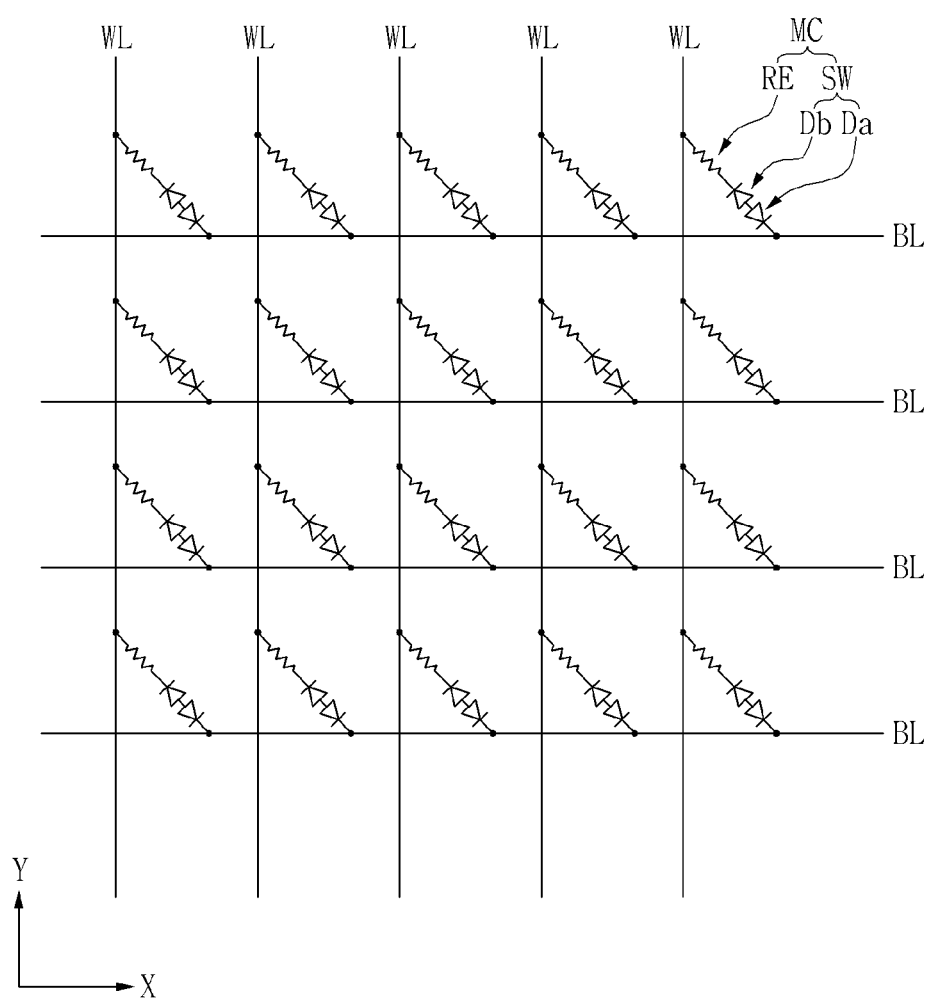
FIGS. 1A and 1B are equivalent circuit diagrams conceptually illustrating resistive memory devices (i.e., ReRAM devices) in accordance with embodiments of the inventive concept.

Various embodiments and examples of embodiments of the inventive concept will be described more fully hereinafter with reference to the accompanying drawings. In the drawings, the sizes and relative sizes and shapes of elements and layers, etc., shown in section may be exaggerated for clarity. In particular, the cross-sectional illustrations of devices and intermediate structures fabricated during the course of their manufacture are schematic. Also, like numerals are used to designate like elements throughout the drawings.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present. Also, the term "connected to" may refer to an electrical connection as will be clear from the context in which the term is used. Thus, when one element is referred to as being "directly connected to" another element, in the context of an electrical connection there are no intervening passive or active electronic components present.

Other terminology used herein for the purpose of describing particular examples or embodiments of the inventive concept is to be taken in context. For example, the terms "comprises", "comprising", "includes" or "including" when used in this specification specifies the presence of stated features or processes but does not preclude the presence or additional features or processes. The term "about" or "substantially the same" when used in connection with dopant concentrations may mean not only precisely within the stated range but also encompasses slight differences from the stated range due to inherent characteristics of processes intended to produce a concentration within the stated range. On the other hand, the term "substantially different" may mean a difference intended to and which gives rise to a noticeable effect, e.g., on reducing leakage current, as compared to the case in which such a difference does not exist.

Equivalent circuits of embodiments of resistive memory devices (e.g., ReRAM devices) in accordance with the inventive concept will now be described in detail with reference to FIGS. 1A and 1B.

Referring to FIG. 1A, a resistive memory device according to the inventive concept may include bit lines BL in parallel each extending in an X direction, word lines WL in parallel each extending in a Y direction perpendicular to the X direction, and memory cells MC each disposed between the bit lines BL and the word lines WL of a respective intersecting pair thereof. The memory cells MC may include switching devices SW and resistor elements RE. Each of the switching devices SW may include a first diode Da and a second diode Db. The first diode Da and the second diode Db may be disposed to act opposite to each other. For example, a cathode (N) electrode of the first diode Da may be directly connected to a cathode (N) electrode of the second diode Db. One electrode of the resistor element RE may be electrically connected to one of the word lines WL, and the other electrode of the resistor element RE may be electrically connected to one electrode of the switching device SW, and the other electrode of the switching device SW may be electrically connected to one of the bit lines BL. Furthermore, the other electrode of the resistor element RE may be directly connected to an anode (P) electrode of the second diode Db, and an anode (P) electrode of the first diode Da may be directly connected to one of the bit lines BL. The bit line BL and the word line WL may be compatible.

Figure 1B:
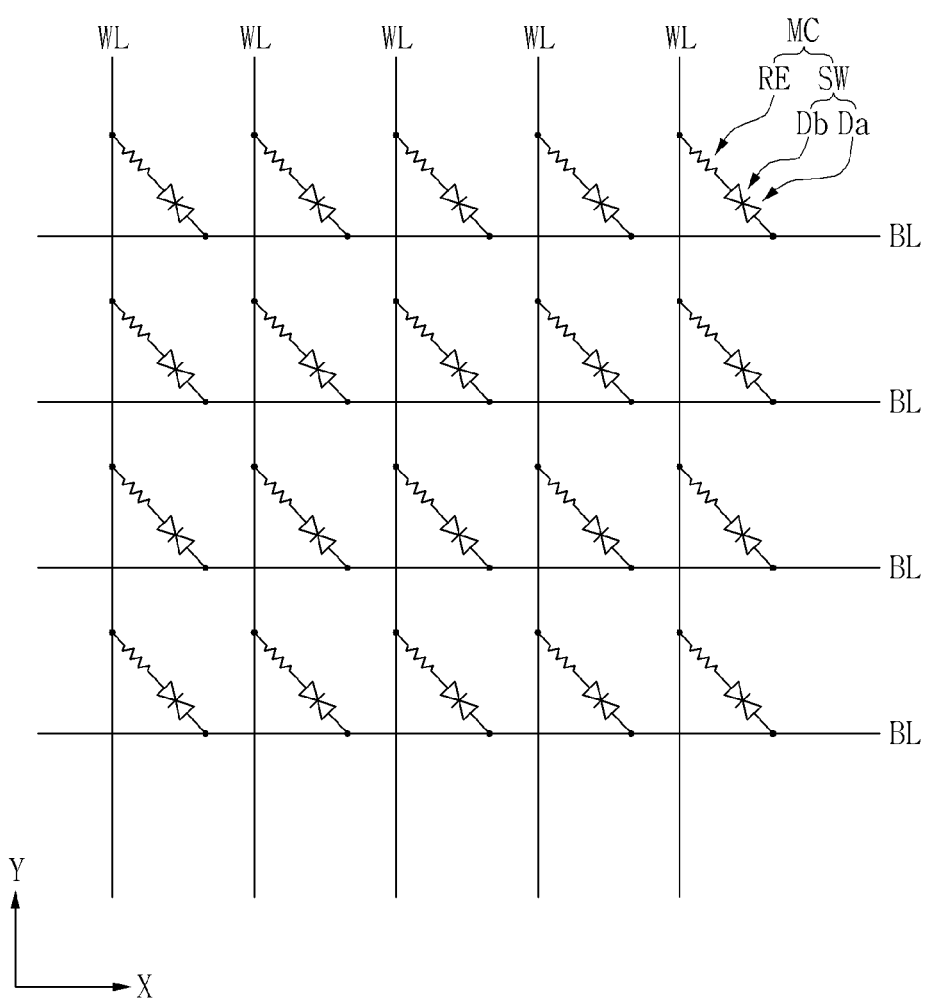

In the embodiment shown in FIG. 1B, the resistive memory device includes switching devices SW each having a first diode Da and a second diode Db which are disposed to act towards each other. For example, an anode (P) electrode of the first diode Da may be connected to an anode (P) electrode of the second diode Db.

Resistance values of the resistor elements RE vary according to potential differences or currents between the bit lines BL and the word lines WL. Accordingly, the resistive memory devices may erase, write, and read logic data "1" or "0" according to the potential differences between the selected or unselected bit lines BL and word lines WL.

Figure 2A:
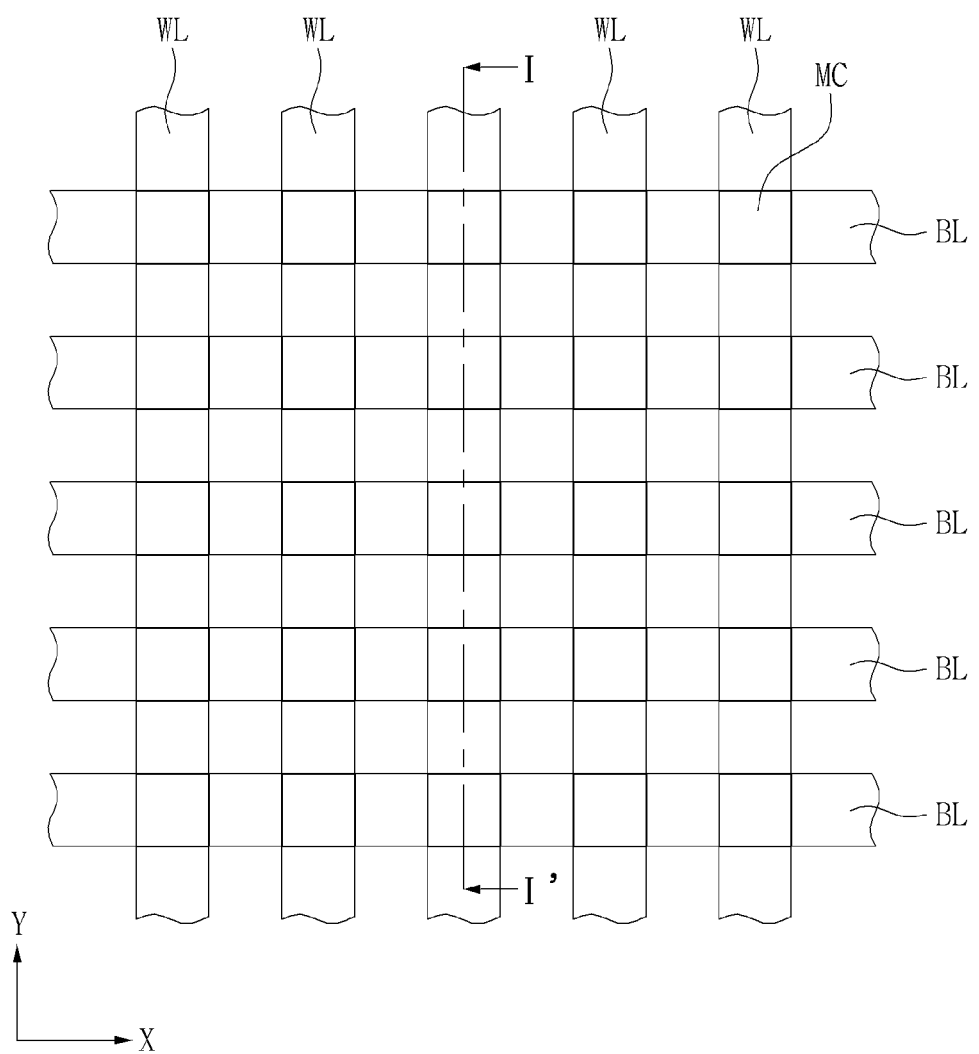
FIGS. 2A and 2B are a layout and a structure, respectively, schematically illustrating the resistive memory devices in accordance with the embodiments of the inventive concept.
Figure 2B:
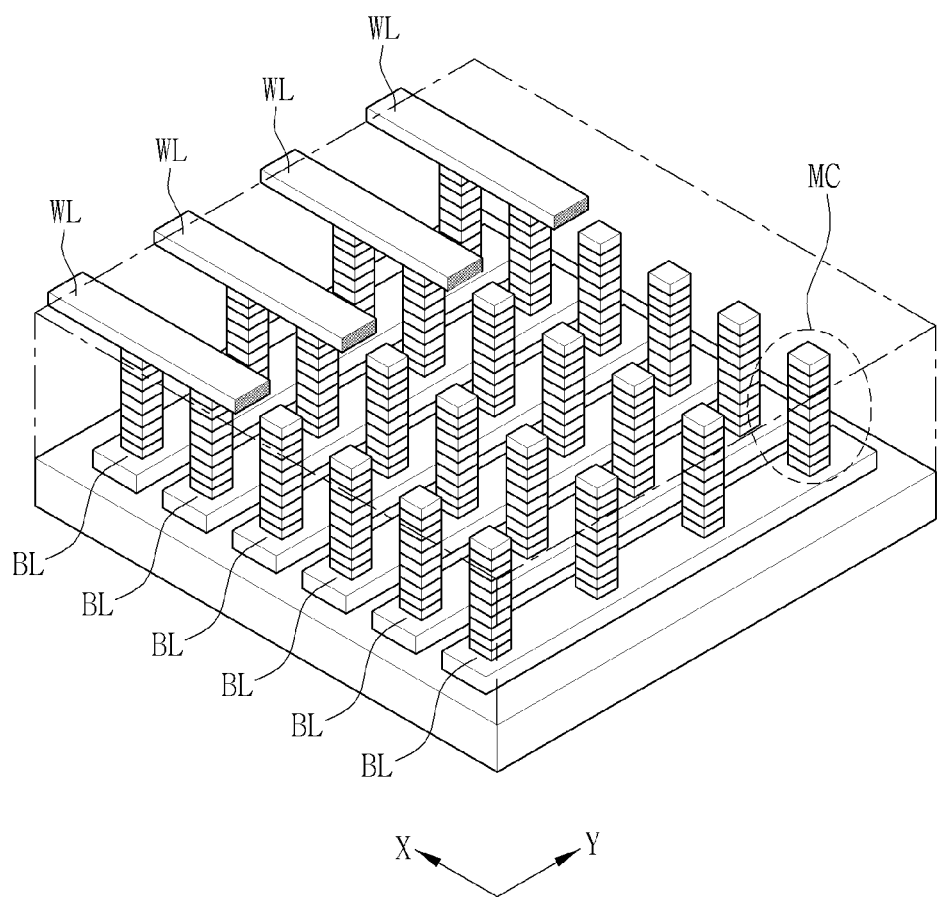

A layout of a resistive memory device in accordance with the inventive concept will now be described with reference to FIG. 2A and FIG. 2B.

The resistive memory device may include bit lines BL in parallel each extending in an X direction, word lines WL in parallel each extending in a Y direction perpendicular to the X direction, and memory cells MC disposed at points at which the bit lines BL cross the word lines WL. The memory cells MC will be described in detail later.

FIGS. 3A to 3D illustrate various embodiments of resistive memory devices in accordance with the inventive concept.

Figure 3A:
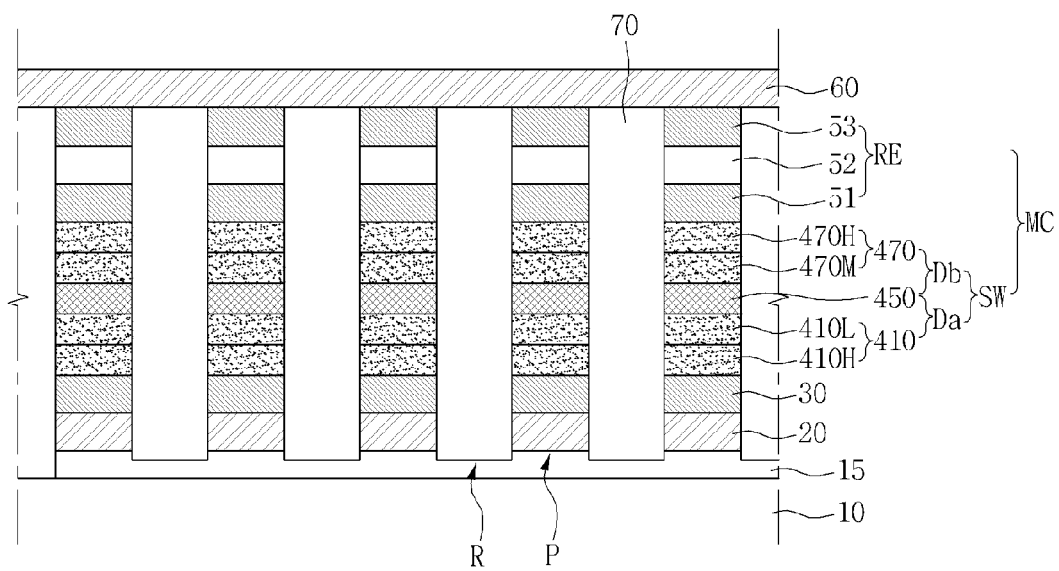
FIGS. 3A to 3D are cross-sectional views schematically illustrating resistive memory devices in accordance with various embodiments of the inventive concept.

Referring to FIG. 3A, an embodiment of a resistive memory device in accordance with the inventive concept may include a bottom insulating layer 15 disposed on a substrate 10, and lower interconnections 20, memory cells MC, and an upper interconnection 60 sequentially stacked on the bottom insulating layer 15. The resistive memory device may further include diode electrodes 30 interposed between the lower interconnections 20 and the memory cells MC and a filling insulating layer 70 between the memory cells MC.

The substrate 10 may comprise a silicon wafer, an SiGe wafer, or a substrate of glass, ceramic, plastic, or other semiconductor material.

The bottom insulating layer 15 may comprise silicon oxide, a metal oxide, silicon nitride, or another insulating material. The bottom insulating layer 15 may include protruding portions P aligned with the lower interconnections 20, and recessed portions R between the lower interconnections 20.

The lower interconnection 20 may comprise a metal, such as tungsten (W), copper (Cu), or aluminum (Al), or a conductive metal compound such as titanium nitride (TiN), tungsten nitride (TaN), or aluminum nitride (AlN). Each lower interconnection 20 may be a bit line or word line.

Each of the memory cells MC may include a switching device SW and a resistor element RE.

The switching device SW may include a lower diode Da and an upper diode Db.

The lower diode Da may include a lower cathode 410 and a common anode 450.

The lower cathode 410 may include a lower high-concentration cathode electrode layer 410H and a lower low-concentration cathode electrode layer 410L disposed on the lower high-concentration cathode electrode layer 410H.

The upper diode Db may include the common anode 450 and an upper cathode 470. The lower diode Da and the upper diode Db may share the common anode 450.

The upper cathode 470 may include an upper middle-concentration cathode electrode layer 470M and an upper high-concentration cathode electrode layer 470H disposed on the upper middle-concentration cathode electrode layer 470M.

The lower cathode 410 and the upper cathode 470 may be formed of silicon doped with a group-V element such as phosphorous (P), arsenic (As), antimony (Sb), or bismuth (Bi).

The common anode 450 may be formed of silicon doped with a group-III element such as boron (B), gallium (Ga), or indium (In).

In another embodiment, the lower high-concentration cathode electrode layer 410H and the upper high-concentration cathode electrode layer 470H may be formed of a metal or metal silicide.

The distribution of the dopant concentration of the lower diode Da (level of dopant concentration in the vertical direction) and the distribution of dopant concentration of the upper diode Db (level of dopant concentration in the vertical direction) are asymmetric about a horizontal plane midway between the lower diode Da and upper diode Db.

In this respect, the high-concentration lower cathode electrode layer 410H may have a relatively high dopant concentration (N+). For example, the high-concentration lower cathode electrode layer 410H may have a peak dopant concentration of about (1E20 to 1E21)/cm$^3$.

The low-concentration lower cathode electrode layer 410L may have a relatively low dopant concentration (N−). For example, the low-concentration lower cathode electrode layer 410L may have a peak dopant concentration of about (1E16 to 1E17)/cm$^3$.

The common anode 450 may have a middle-range dopant concentration (P0). For example, the common anode 450 may have a peak dopant concentration of about (1E18 to 5E18)/cm$^3$.

The middle-concentration upper cathode electrode layer 470M may have a middle-range dopant concentration (N0). For example, the middle-concentration upper cathode electrode layer 470M may have a peak dopant concentration of about (1E18 to 5E18)/cm$^3$.

The high-concentration upper cathode electrode layer 470H may also have a relatively high dopant concentration (N+) such as that of the high-concentration lower cathode electrode layer 410H. For example, the upper high-concentration cathode electrode layer 470H may have a peak dopant concentration of about (1E20 to 1E21)/cm$^3$.

The resistor element RE may include a lower electrode 51, a resistor layer 52, and an upper electrode 53.

The lower electrode 51 may comprise a metal compound such as titanium nitride (TiN), tantalum nitride (TaN), or aluminum nitride (AlN).

The resistor layer 52 may comprise a metal oxide such as titanium oxide (TiO), nickel oxide (NiO), hafnium oxide (HfO), aluminum oxide (AlO), zirconium oxide (ZrO), zinc oxide (ZnO), niobium oxide (NbO), or tungsten oxide (WO).

The upper electrode 53 may comprise a metal compound such as titanium nitride (TiN), tantalum nitride (TaN), or aluminum nitride (AlN).

The upper interconnection 60 may comprise a metal, such as tungsten (W), copper (Cu), or aluminum (Al), or a conductive metal compound such as titanium nitride (TiN), tungsten nitride TaN, or aluminum nitride (AlN). The upper interconnection 60 may be used as a word line or bit line.

The diode electrode 30 may comprise a metal compound such as titanium nitride (TiN), tantalum nitride (TaN), or aluminum nitride (AlN). The diode electrode 30 may be a multilayered structure such as a titanium/titanium nitride (Ti/TiN) or tantalum/tantalum nitride (Ta/TaN) structure.

The filling insulating layer 70 may fill the space between the memory cells MC, and more particularly, between the switching devices SW. The filling insulating layer 70 may comprise silicon nitride. The filling insulating layer 70 may be of insulating material different from the resistor layer 52. That is, the resistor layer 52 may comprise an oxide, and the filling insulating layer 70 may comprise a nitride.

Figure 3B:
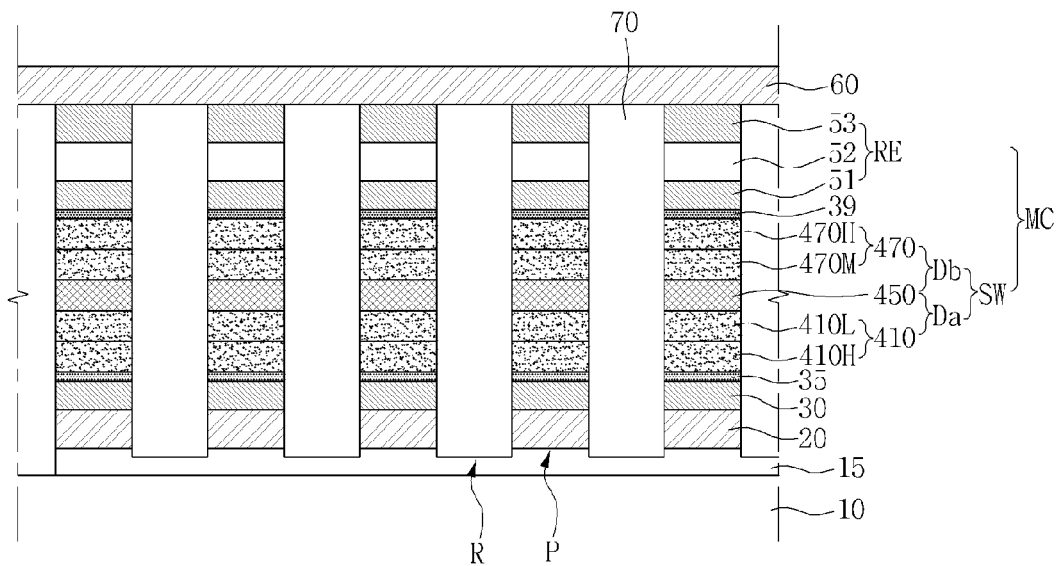

Referring to FIG. 3B, this embodiment of a resistive memory device in accordance with the inventive concept is similar to that of FIG. 3A but further includes a lower buffer 35 interposed between the diode electrode 30 and the lower cathode 410, and an upper buffer 39 interposed between the upper cathode 470 and the lower electrode 51 of the resistor element RE. The lower buffer 35 and the upper buffer 39 may include material which facilitates adhesion of the layers on opposite sides thereof, such as titanium (Ti) or tantalum (Ta), or a metal silicide such as titanium silicide (TiSi), tantalum silicide (TaSi), tungsten silicide (WSi), cobalt silicide (CoSi), or nickel silicide (NiSi). That is, the lower buffer 35 may improve adhesion between the diode electrode 30 and the lower cathode 410, and the upper buffer 39 may improve adhesion between the upper cathode 470 and the lower electrode 51 of the resistor element RE.

Figure 3C:
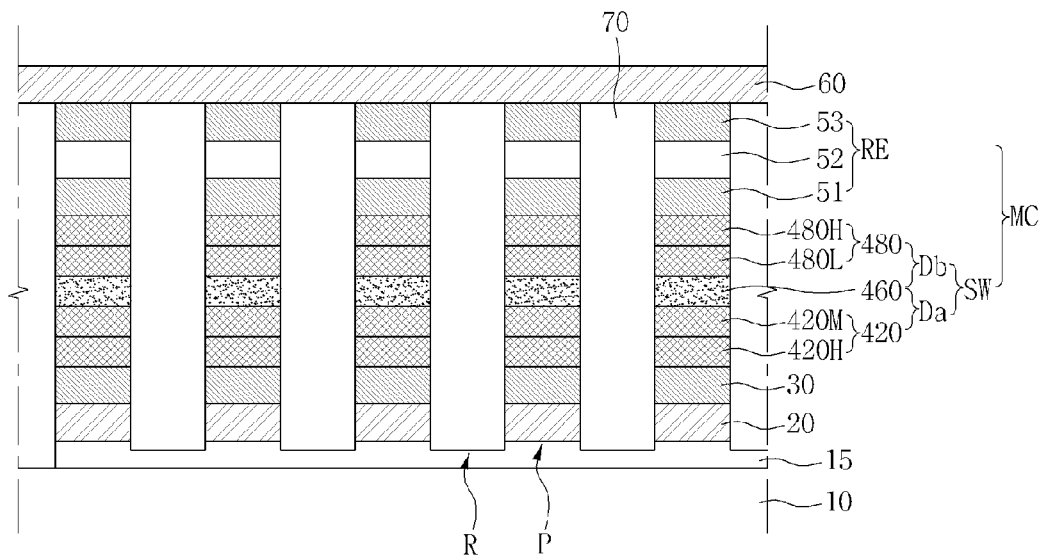
Figure 3D:
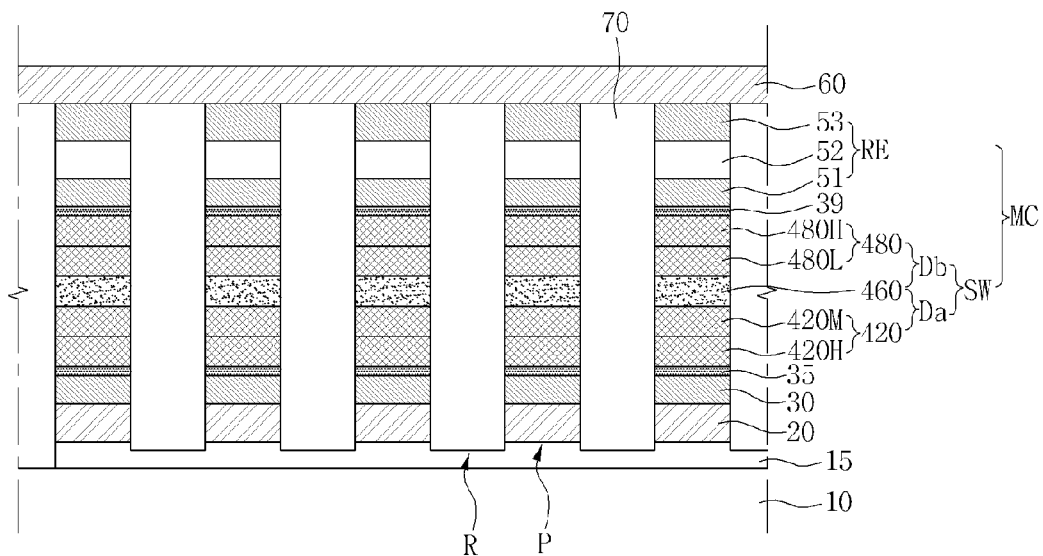

Referring to FIG. 3C, another embodiment of a resistive memory device in accordance with the inventive concept may include a bottom insulating layer 15 disposed on a substrate 10, and lower interconnections 20, memory cells MC, and an upper interconnection 60 sequentially stacked on the bottom insulating layer 15. The resistive memory device may further include diode electrodes 30 interposed between the lower interconnections 20 and the memory cells MC. Each of the memory cells MC may include a switching device SW and a resistor element RE. The switching device SW may include a lower diode Da and upper diode Db.

The lower diode Da may include a lower anode 420 and a common cathode 460.

The lower anode 420 may include a high-concentration lower anode electrode layer 420H and a middle-concentration lower anode electrode layer 420M on the high-concentration lower anode electrode layer 420H.

The upper diode Db may include the common cathode 460 and an upper anode 480.

The upper anode 480 may include a low-concentration upper anode electrode layer 480L and a high-concentration upper anode electrode layer 480H disposed on the low-concentration upper anode electrode layer 480L.

The high-concentration lower anode electrode layer 420H, the middle-concentration lower anode electrode layer 420M, the low-concentration upper anode electrode 480L, and the high-concentration upper anode electrode layer 480H may comprise silicon doped with a group-III element such as boron (B), gallium (Ga), or indium (In). The common cathode electrode 460 may comprise silicon doped with a group-V element such as phosphorous (P), arsenic (As), antimony (Sb), or bismuth (Bi). In another embodiment, the high-concentration lower anode electrode layer 420H and the high-concentration anode electrode 480H upper may comprise a metal or metal silicide.

The high-concentration lower anode electrode layer 420H may have a relatively high dopant concentration (P+). For example, the high-concentration lower anode electrode layer 420H may have a peak dopant concentration of about (1E20 to 1E21)/cm$^3$.

The middle-concentration lower anode electrode layer 420M may have a relatively middle-range dopant concentration (P0). For example, the middle-concentration lower anode electrode layer 420M may have a peak dopant concentration of about (1E18 to 5E18)/cm$^3$.

The common cathode 460 may have a middle-range dopant concentration (NO). For example, the common cathode 460 may have a peak dopant concentration of about (1E18 to 5E18)/cm$^3$.

The low-concentration upper anode electrode layer 480L may have a relatively low dopant concentration (P−). For example, the low-concentration upper anode electrode layer 480L may have a peak dopant concentration of about (1E16 to 1E17)/cm$^3$.

The high-concentration upper anode electrode layer 480H may have a relatively high dopant concentration (P+) such as that of the high-concentration lower anode electrode layer 420H. For example, the high-concentration upper anode electrode layer 480H may have a peak dopant concentration of about (1E20 to 1E21)/cm$^3$.

Referring to 3D, another embodiment of a resistive memory device in accordance with the inventive concept is similar to that of FIG. 3C but further includes a lower buffer 35 interposed between the diode electrode 30 and the lower anode 420, and an upper buffer 39 interposed between the upper anode 480 and the lower electrode 51 of the resistor element RE.

FIGS. 4A to 4D illustrate other embodiments of resistive memory devices in accordance with of the inventive concept.

Figure 4A:
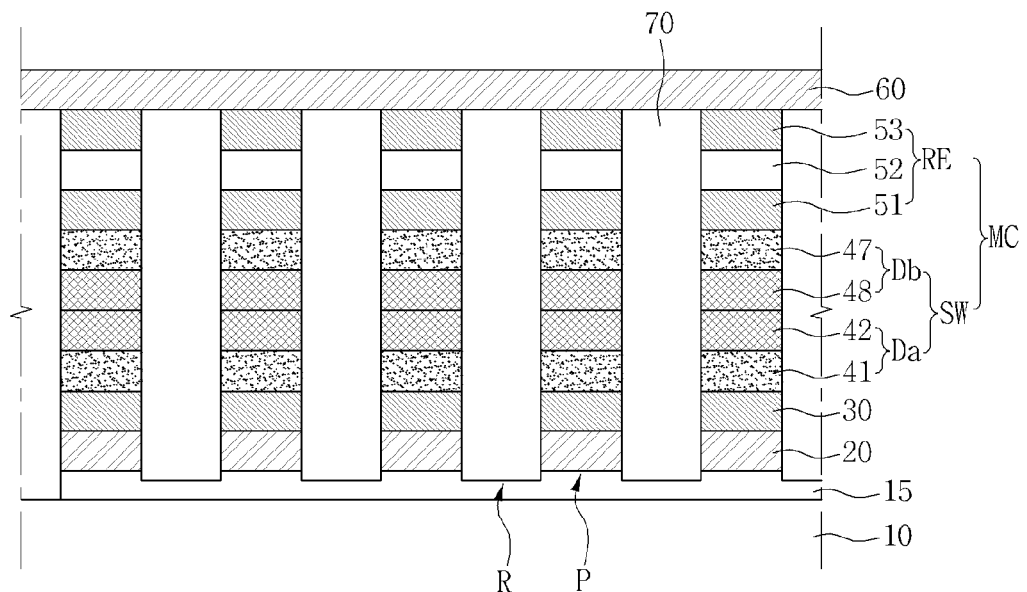
FIGS. 4A to 4D are cross-sectional views schematically illustrating switching devices of the resistive memory devices in accordance with various embodiments of the inventive concept.

Referring to FIG. 4A, a resistive memory device may include a bottom insulating layer 15 disposed on a substrate 10, and lower interconnections 20, memory cells MC, and an upper interconnection 60 sequentially stacked on the bottom insulating layer 15. The resistive memory device may further include diode electrodes 30 interposed between the lower interconnections 20 and the memory cells MC.

Each of the memory cells MC may include a switching device SW and a resistor element RE.

The switching device SW may include a lower diode Da and an upper diode Db.

The lower diode Da may include a lower cathode (electrode layer) 41 and a lower anode (electrode layer) 42 disposed on the lower cathode electrode 41.

The upper diode Db may include an upper anode (electrode layer) 48 and upper cathode (electrode layer) 47 disposed on the upper anode electrode 48. The lower anode electrode 42 may be directly connected to the upper anode 48.

The lower cathode 41 and the upper cathode 47 may comprise silicon doped with a group-V element such as phosphorous (P), arsenic (As), antimony (Sb), or bismuth (Bi).

The lower anode 42 and the upper anode 48 may comprise silicon doped with a group-III element such as boron (B), gallium (Ga), or indium (In).

The lower cathode 41 may have a relatively high dopant concentration (N+). For example, the lower cathode 41 may have a peak dopant concentration of about (1E20 to 1E21)/cm$^3$.

The lower anode 42 may have a relatively low dopant concentration (P−). For example, the lower anode 42 may have a peak dopant concentration of about (1E16 to 1E17)/cm$^3$.

The upper anode 48 may have a middle-range dopant concentration (P0). For example, the upper anode 48 may have a peak dopant concentration of about (1E18 to 5E18)/cm$^3$.

The upper cathode 47 may have a relatively high dopant concentration (N+) such as that of the lower cathode 41. For example, the upper cathode 47 may have a peak dopant concentration of about (1E20 to 1E21)/cm$^3$.

Figure 4B:
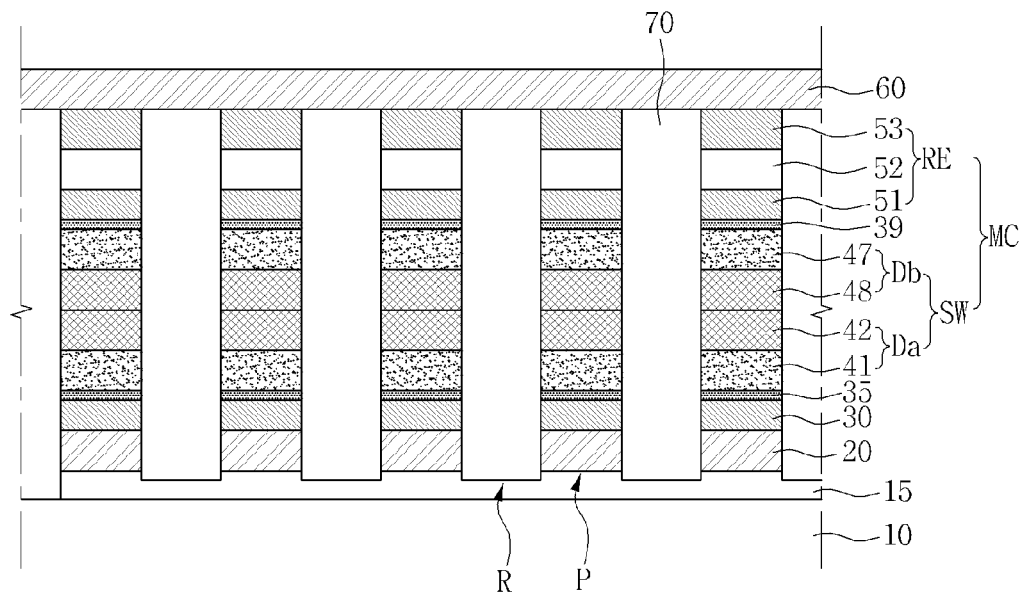

Referring to FIG. 4B, another embodiment of a resistive memory device in accordance with the inventive concept is similar to that of FIG. 4A but further includes a lower buffer 35 interposed between the diode electrode 30 and the lower cathode electrode 41, and an upper buffer 39 interposed between the upper cathode electrode 47 and the lower electrode 51 of the resistor element RE.

Figure 4C:
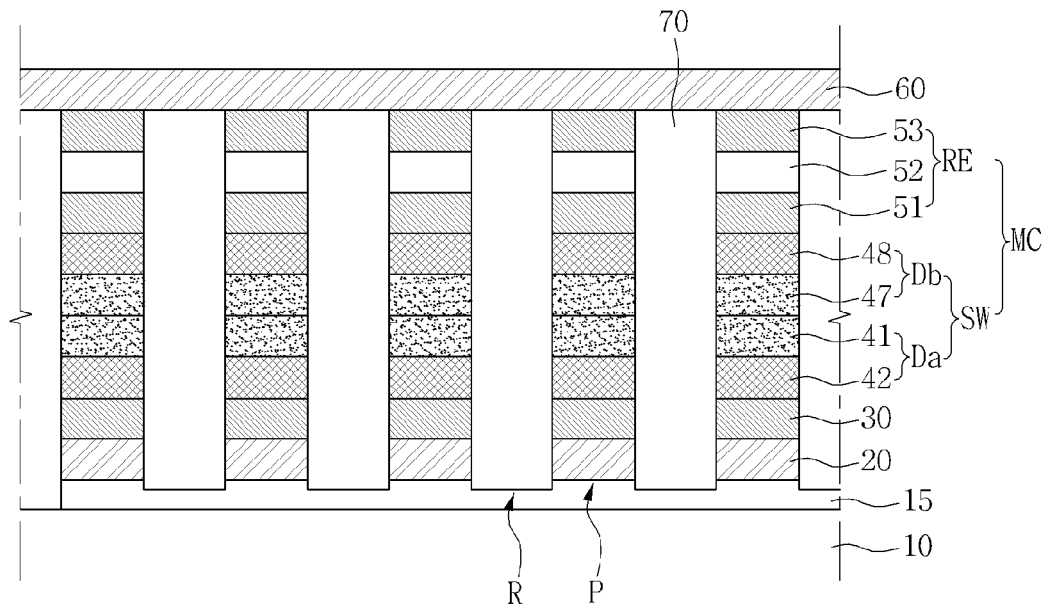

Referring to FIG. 4C, still another embodiment of a resistive memory device in accordance with the inventive concept may include a bottom insulating layer 15 disposed on a substrate 10, and lower interconnections 20, memory cells MC, and an upper interconnection 60 sequentially stacked on the bottom insulating layer 15. The resistive memory device may further include diode electrodes 30 interposed between the lower interconnections 20 and the memory cells MC. Each of the memory cell MC may include a switching device SW and a resistor element RE. The switching device SW may include a lower diode Da and an upper diode Db.

The lower diode Da may include a lower anode (electrode layer) 42 and a lower cathode (electrode layer) 41 disposed on the lower anode electrode 42.

The upper diode Db may include an upper cathode (electrode layer) 47 and an upper anode (electrode layer) 48 disposed on the upper cathode (electrode layer) 47.

The lower anode 42 and the upper anode 48 may comprise silicon doped with a group-V element such as phosphorous (P), arsenic (As), antimony (Sb), or bismuth (Bi). The lower cathode 41 and the upper cathode 47 may comprise silicon doped with a group-III element such as boron (B), gallium (Ga), or indium (In).

The lower anode 42 may have a relatively high dopant concentration (P+). For example, the lower anode 42 may have a peak dopant concentration of about (1E20 to 1E21)/cm$^3$.

The lower cathode 41 may have a middle-range dopant concentration (N0). For example, the lower cathode 41 may have a peak dopant concentration of about (1E18 to 5E18)/cm$^3$.

The upper cathode 47 may have a relatively low dopant concentration (N−). For example, the upper cathode 47 may have a peak dopant concentration of about (1E16 to 1E17)/cm$^3$.

The upper anode 48 may have a relatively high dopant concentration (P+) such as that of the lower anode 42. For example, the upper anode 48 may have a peak dopant concentration about (1E20 to 1E21)/cm$^3$.

Figure 4D:
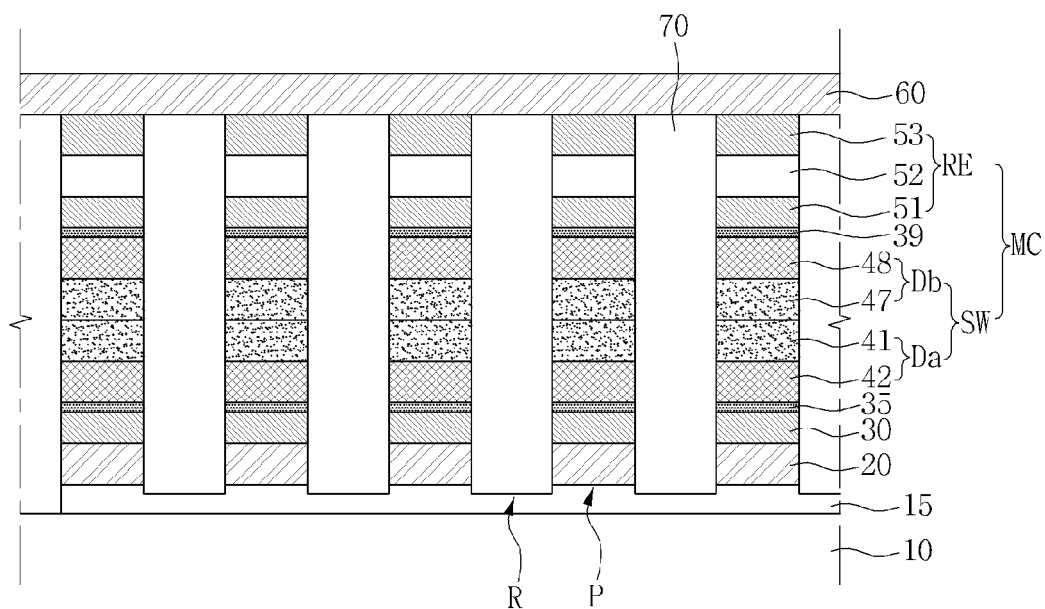

Referring to FIG. 4D, another embodiment of resistive memory device in accordance with the inventive concept is similar to that of FIG. 4C but further includes a lower buffer 35 interposed between the diode electrode 30 and the lower diode Da, and an upper buffer 39 interposed between the upper diode Db and the lower electrode 51.

Figure 5:
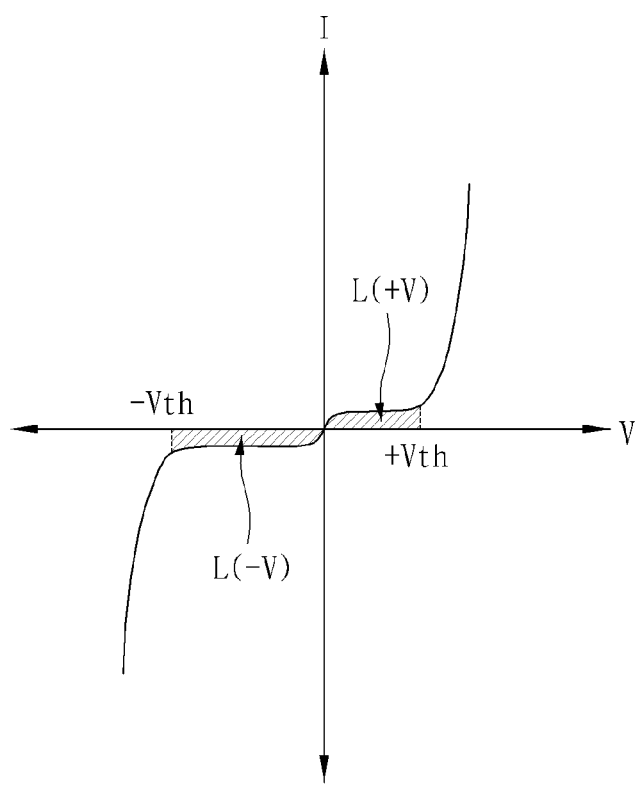
FIG. 5 is an I-V curve diagram illustrating operations of the resistive memory devices in accordance with various embodiments of the inventive concept.

FIG. 5 is an I-V curve diagram illustrating operations of the various embodiments of the resistive memory devices in accordance with the inventive concept.

Referring to FIG. 5, embodiments of resistive memory devices in accordance with an aspect of the inventive concept have a symmetrical I-V characteristic and shift in a −X axis direction, that is, a −V direction. When performing a read operation, the resistive memory device may apply a negative bias toward an unselected memory cell. A leakage current is always present in a diode when the negative bias is applied. In the negative bias state, the leakage current may be determined as an area of an integral of $V_{th}$ in a first quadrant of an I-V curve, and indicated as L(+V) in FIG. 5. The leakage current with respect to the negative bias may be minimal in embodiments of resistive memory devices having a shift in their I-V characteristics.

FIGS. 6A to 6D illustrate an embodiment of a method of forming a resistive memory device in accordance with the inventive concept.

Figure 6A:
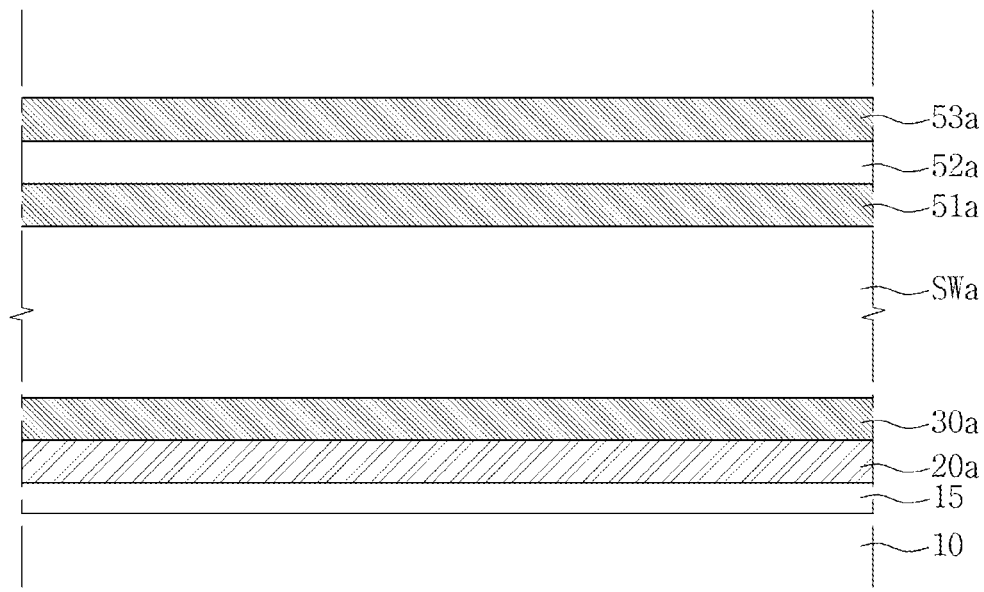
FIGS. 6A to 6D are cross-sectional views schematically illustrating a method of forming a resistive memory device in accordance with an embodiment of the inventive concept.

Referring to FIG. 6A, a method of forming a resistive memory device in accordance with the inventive concept may include forming a bottom insulating layer 15, a lower interconnection material layer 20a, a diode electrode material layer 30a, a switching device layer SWa, a lower electrode material layer 51a, a resistor material layer 52a, and an upper electrode material layer 53a on a substrate 10.

The substrate 10 may be a single-crystalline silicon wafer or a compound semiconductor wafer such as a SiGe wafer.

The forming of the bottom insulating layer 15 may include forming an insulating material layer, such as a silicon oxide layer, on the substrate 10 by performing an atomic layer deposition (ALD) process or a chemical vapor deposition (CVD) process.

The forming of the lower interconnection material layer 20a may include forming a metal layer or a conductive metal compound layer on the bottom insulating layer 15 by performing a physical vapor deposition (PVD) process or a CVD process.

The forming of the diode electrode material layer 30a may include forming one or more layers each of a metal or metal compound, such as titanium (Ti), titanium nitride (TiN), tantalum (Ta), or tantalum nitride (TaN), on the lower interconnection material layer 20a by performing a PVD process or CVD process, or by forming a metal silicide layer on the lower interconnection material layer 20a by a silicidation process.

The forming of the switching device layer SWa may include forming a multilayered doped poly-crystalline silicon layer. A method of forming the switching device layer SWa will be described in more detail below.

The forming of the lower electrode material layer 51a may include forming a metal layer or a metal compound layer on the switching device layer SWa by performing a PVD process, a CVD process, and/or a metal-nitride process.

The forming of the resistor material layer 52a may include forming a metal oxide layer on the lower electrode material layer 51a by performing a deposition process. The metal oxide layer may include one of titanium oxide (TiO), nickel oxide (NiO), hafnium oxide (HfO), aluminum oxide (AlO), zirconium oxide (ZrO), zinc oxide (ZnO), niobium oxide (NbO), and tungsten oxide (WO).

The forming of the upper electrode material layer 53a may include forming a metal layer or a conductive metal compound layer on the resistor material layer 52a by performing a PVD process, a CVD process, and/or a metal-nitride process.

The lower interconnection material layer 20a, the lower electrode material layer 51a, and the upper electrode material layer 53a may include at least one of platinum (Pt), ruthenium (Ru), ruthenium nitride (RuN), iridium (Ir), iridium nitride (IrN), silver (Ag), aluminum (Al), titanium (Ti), titanium nitride (TiN), tantalum (Ta), tantalum nitride (TaN), tungsten (W), tungsten nitride WN, doped-Si, copper (Cu), nickel (Ni), and cobalt (Co).

The diode electrode material layer 30a may be used as an adhesive layer, i.e., to improve adhesion between the lower interconnection material layer 20a and the switching device layer SWa, and/or as an ohmic layer which may prevent diffusion of atoms. For example, the lower buffer 35 may include a metal layer of titanium (Ti) or tantalum (Ta).

Figure 6B:
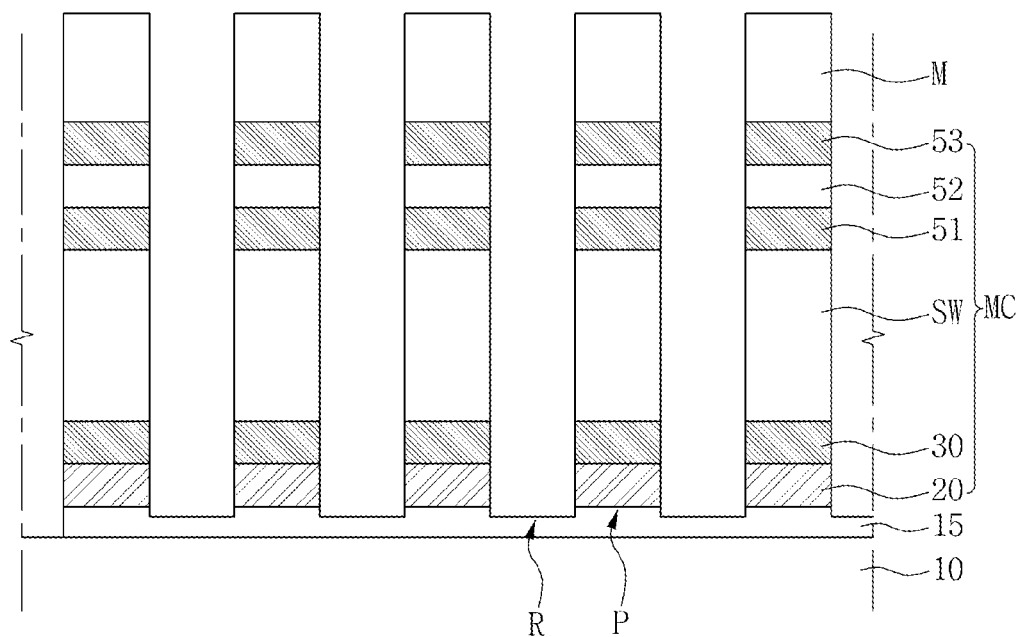

Referring to FIG. 6B, the method may include forming a mask M on the upper electrode material layer 53a, and forming memory cells MC by etching the upper electrode material layer 53a, the resistor material layer 52a, the lower electrode material layer 51a, the switching device layer SWa, the diode electrode 30, and the lower interconnection material layer 20a by using the mask M as an etch mask. Each of the memory cells MC may include a lower interconnection 20, a diode electrode 30, a switching device SW, a lower electrode 51, a resistor layer 52, and an upper electrode 53. The bottom insulating layer 15 may be partly recessed. Then, the mask M may be removed.

Figure 6C:
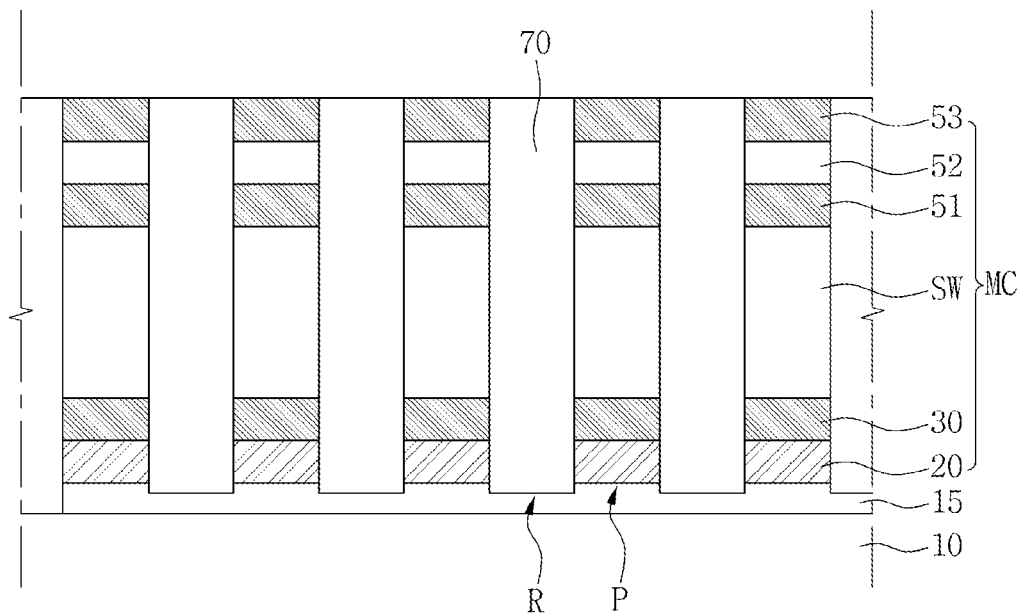

Referring to FIG. 6C, the method may include forming a filling insulating layer 70 to such a thickness as to fill spaces between the memory cells MC and cover the memory cells MC, and then exposing upper surfaces of the upper electrodes 53 by performing a planarization process on the filling insulating layer 70. The filling insulating layer 70 may be formed of silicon nitride. The planarization process may include a CMP or etch-back process.

Figure 6D:
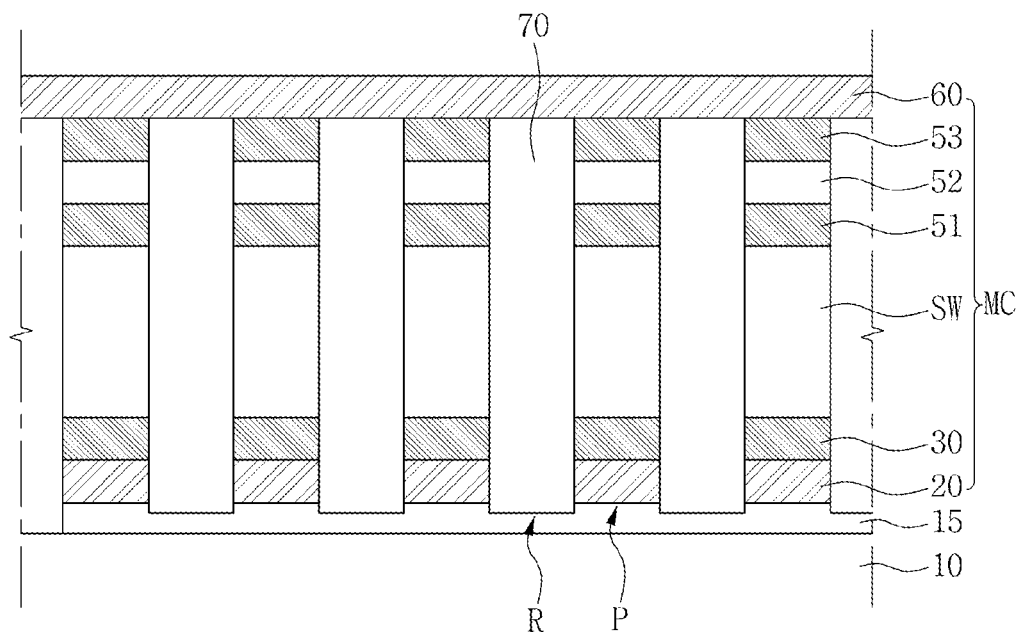

Referring to FIG. 6D, the method may include forming an upper interconnection 60 on the upper electrodes 53 and the filling insulating layer 70. The upper interconnection 60 may include at least one of platinum (Pt), ruthenium (Ru), ruthenium nitride (RuN), iridium (Ir), iridium nitride (IrN), silver (Ag), aluminum (Al), titanium (Ti), titanium nitride (TiN), tantalum (Ta), tantalum nitride (TaN), tungsten (W), tungsten nitride WN, doped-Si, copper (Cu), nickel (Ni), and cobalt (Co).

FIGS. 7A to 7D illustrate another embodiment of a method of forming a resistive memory device in accordance with the inventive concept.

Figure 7A:
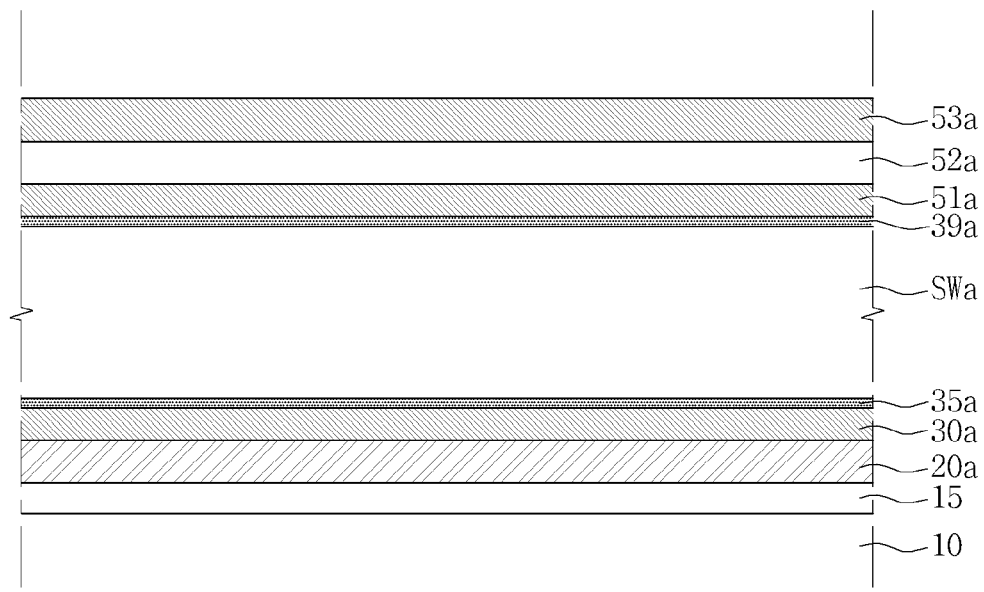
FIGS. 7A to 7D are cross-sectional views schematically illustrating a method of forming a resistive memory device in accordance with another embodiment of the inventive concept.

Referring to FIG. 7A, the method of forming the resistive memory device may include forming a bottom insulating layer 15, a lower interconnection material layer 20a, a diode electrode material layer 30a, a lower buffer material layer 35a, a switching device layer SWa, an upper buffer material layer 39a, a lower electrode material layer 51a, a resistor material layer 52a, and an upper electrode material layer 53a on a substrate 10. The lower buffer material layer 35a may be of the same metal as the diode electrode material layer 30a. The upper buffer material layer 39a may be of the same metal as the lower electrode material layer 51a. For example, the lower buffer material layer 35a and the upper buffer material layer 39a may be layers of titanium (Ti) or tantalum (Ta).

Figure 7B:
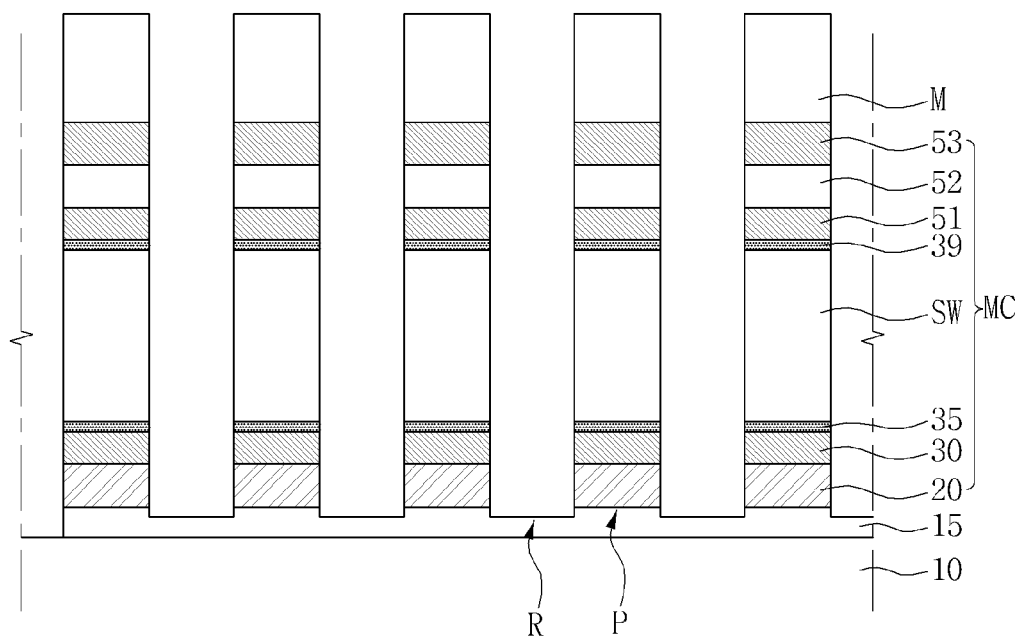

Referring to FIG. 7B, the method may include forming a mask M on the upper electrode material layer 53a, and forming memory cells MC by etching the upper electrode material layer 53a, the resistor material layer 52a, the lower electrode material layer 51a, the upper buffer material layer 39a, the switching device layer SWa, the lower buffer material layer 35a, the diode electrode material layer 30a, and the lower interconnection material layer 20a by using the mask M as an etch mask. Each of the memory cells MC may include a lower interconnection 20, a diode electrode 30, a lower buffer 35, a switching device SW, an upper buffer 39, a lower electrode 51, a resistor layer 52, and an upper electrode 53. Then, the mask pattern M may be removed.

Figure 7C:
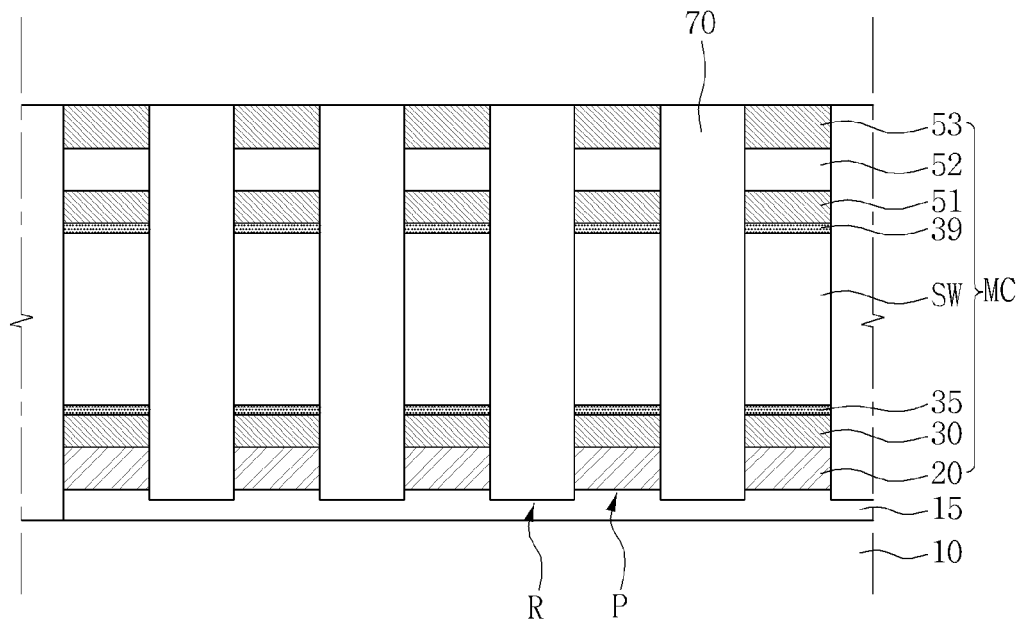

Referring to FIG. 7C, the method may include forming a filling insulating layer 70 to such a thickness as to fill the spaces between and cover the memory cells MC, and exposing upper surfaces of the upper electrodes 53 by performing a planarization process on the filling insulating layer 70. The filling insulating layer 70 may comprise silicon oxide, silicon nitride, or metal oxide. The planarization process may include a CMP or etch-back process.

Figure 7D:
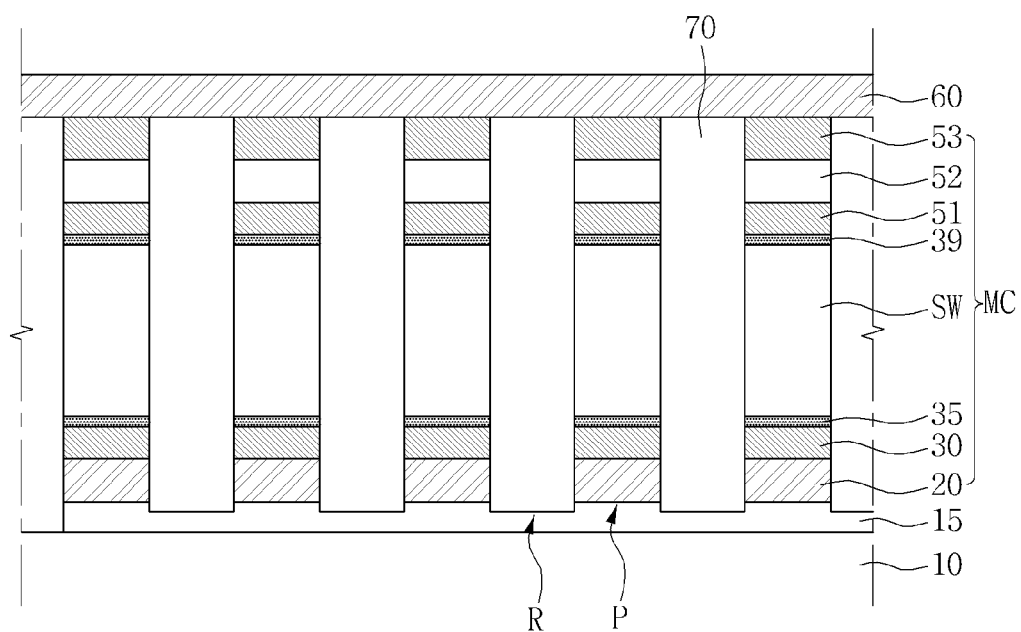

Referring to FIG. 7D, the method may include forming an upper interconnection 60 on the upper electrodes 53 and the filling insulating layer 70. The upper interconnection 60 may include at least one of platinum (Pt), ruthenium (Ru), ruthenium nitride (RuN), iridium (Ir), iridium nitride (IrN), silver (Ag), aluminum (Al), titanium (Ti), titanium nitride (TiN), tantalum (Ta), tantalum nitride (TaN), tungsten (W), tungsten nitride WN, doped-Si, copper (Cu), nickel (Ni), and cobalt (Co).

FIGS. 8A to 8D illustrate the forming of switching layers SWa in accordance with various embodiments of methods according to the inventive concept.

Figure 8A:
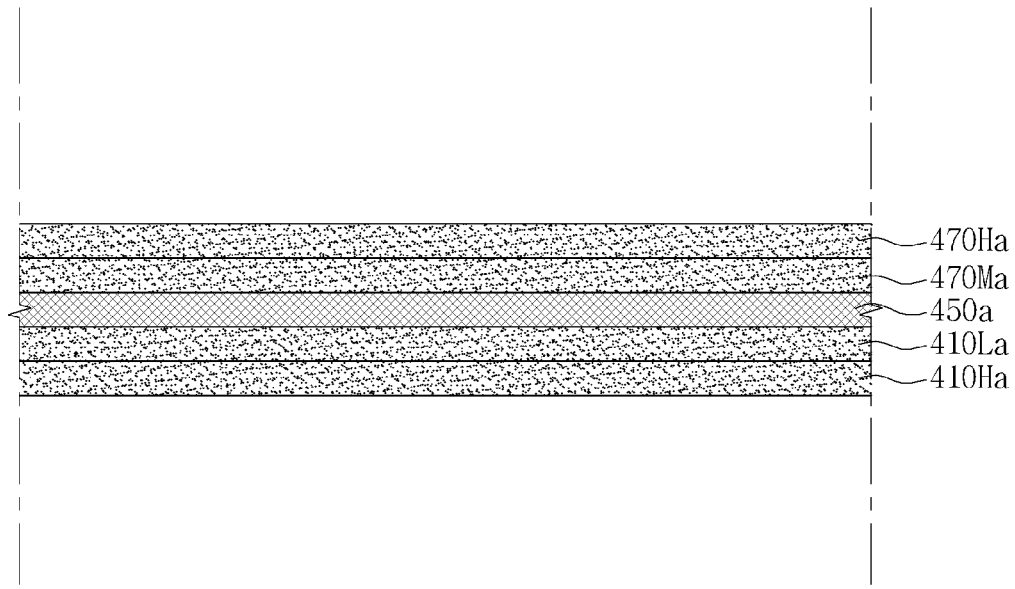
FIGS. 8A to 8D are views illustrating a method of forming switching devices in accordance with various embodiments of the inventive concept.

Referring to FIG. 8A, the method of forming the switching layer SWa in the embodiment of FIGS. 6A-D or 7A-D (at the stages shown in FIG. 6A or 7A, respectively) may include forming a high-concentration lower cathode electrode material layer 410Ha, a low-concentration lower cathode electrode material layer 410La, a common anode electrode material layer 450a, a middle-concentration upper cathode electrode material layer 470Ma, and a high-concentration upper cathode electrode material layer 470Ha.

The forming of the high-concentration lower cathode electrode material layer 410Ha, the low-concentration lower cathode electrode material layer 410La, the common anode electrode material layer 450a, the middle-concentration upper cathode electrode material layer 470Ma, and the high-concentration upper cathode electrode material layer 470Ha may include forming doped poly-crystalline silicon layers by performing an ALD process, a low-pressure CVD (LP-CVD) process, an ion implanting process, and/or an ion diffusion process.

The high-concentration lower cathode electrode material layer 410Ha may have a relatively high dopant concentration, for example, a peak dopant concentration of about (1E20 to 1E21)/cm$^3$.

The low-concentration lower cathode electrode material layer 410La may have a relatively middle-range dopant concentration, for example, a peak dopant concentration of about (1E18 to 5E18)/cm$^3$.

The common anode electrode material layer 450a may have a middle-range dopant concentration, for example, a peak dopant concentration of about (1E18 to 5E18)/cm$^3$.

The middle-concentration upper cathode electrode material layer 470Ma may have a relatively low dopant concentration, for example, a peak dopant concentration of about (1E16 to 1E17)/cm$^3$.

The high-concentration upper cathode electrode material layer 470Ha may have a relatively high dopant concentration, for example, a peak dopant concentration of about (1E20 to 1E21)/cm$^3$, such as that of the high-concentration lower cathode electrode material layer 410Ha.

Then, the method may continue with either of the processes described with reference to FIG. 6B or 7B.

Figure 8B:
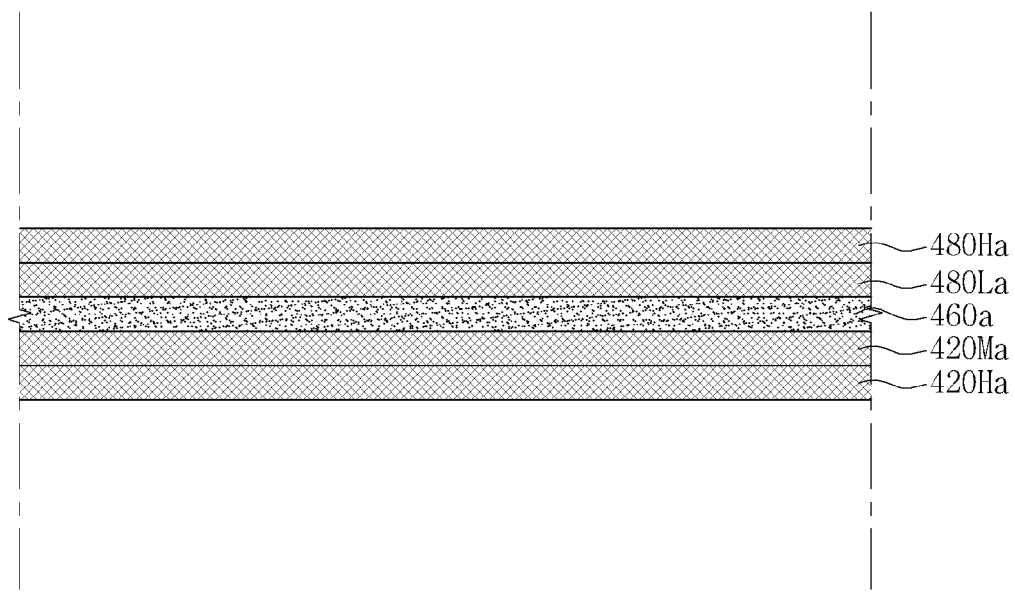

Referring to FIG. 8B, the method of forming the switching layer SWa in the embodiment of FIGS. 6A-D or 7A-D (at the stages shown in FIG. 6A or 7A, respectively) may include forming a high-concentration lower anode electrode layer 420Ha, a middle-concentration lower anode electrode material layer 420Ma, a common cathode electrode material layer 460a, an low-concentration upper anode electrode material layer 480La, and an high-concentration upper anode electrode material layer 480Ha.

The high-concentration lower anode electrode layer 420Ha may have a relatively high dopant concentration, for example, a peak dopant concentration of about (1E20 to 1E21)/cm$^3$.

The middle-concentration lower anode electrode material layer 420Ma may have a relatively middle-range dopant concentration, for example, a peak dopant concentration of about (1E18 to 5E18)/cm$^3$.

The common cathode electrode material layer 460a may have a middle-range dopant concentration, for example, a peak dopant concentration of about (1E18 to 5E18)/cm$^3$.

The low-concentration upper anode electrode material layer 480La may have a relatively low dopant concentration, for example, a peak dopant concentration of about (1E16 to 1E17)/cm$^3$.

The high-concentration upper anode electrode material layer 480Ha may have a relatively high dopant concentration, for example, a peak dopant concentration of about (1E20 to 1E21)/cm$^3$, such as that of the high-concentration lower anode electrode layer 420Ha.

Then, the method may continue with either of the processes described with reference to FIG. 6B or 7B.

Figure 8C:
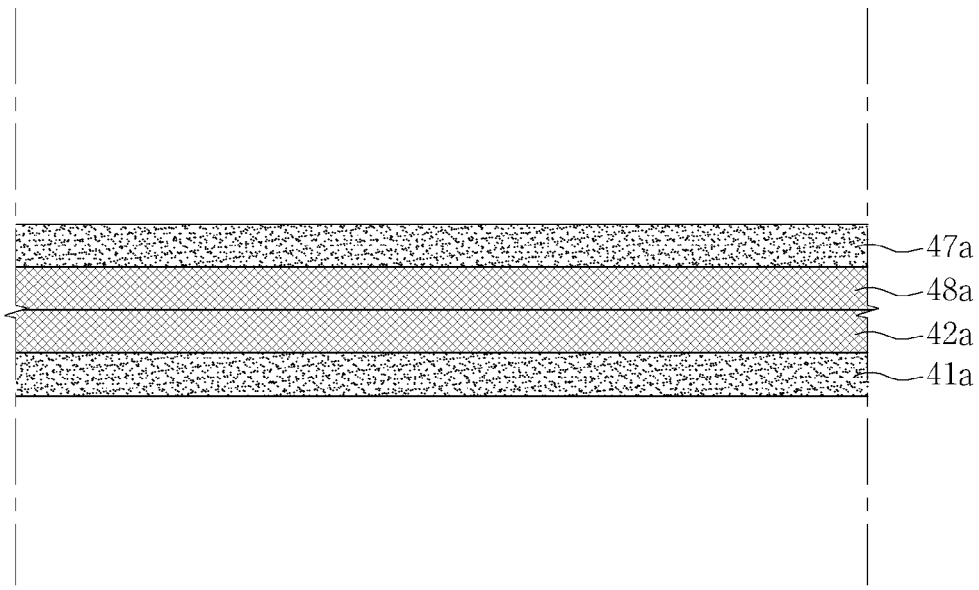

Referring to FIG. 8C, the method of forming the switching layer SWa in the embodiment of FIGS. 6A-D or 7A-D (at the stages shown in FIG. 6A or 7A, respectively) may include forming a lower cathode electrode material layer 41a, a lower anode electrode material layer 42a, an upper anode electrode material layer 48a, and an upper cathode electrode material layer 47a.

The lower cathode electrode material layer 41a and the upper cathode electrode material layer 47a may comprise silicon doped with a group-V element such as phosphorous (P), arsenic (As), antimony (Sb), or bismuth (Bi).

The lower anode electrode material layer 42a and the upper anode electrode material layer 48a may comprise silicon doped with a group-III element such as boron (B), gallium (Ga), or indium (In).

The lower cathode electrode material layer 41a may have a relatively high dopant concentration, for example, a peak dopant concentration of about (1E20 to 1E21)/cm$^3$.

The lower anode electrode material layer 42a may have a relatively middle-range dopant concentration, for example, a peak dopant concentration of about (1E18 to 5E18)/cm$^3$.

The upper anode electrode material layer 48a may have a relatively low dopant concentration, for example, a peak dopant concentration of about (1E16 to 1E17)/cm$^3$.

The upper cathode electrode material layer 47a may have a relatively high dopant concentration, for example, a peak dopant concentration of about (1E20 to 1E21)/cm$^3$, such as that of the lower cathode electrode material layer 41a.

Then, the method may proceed to either of the processes described with reference to FIG. 6B or 7B.

Figure 8D:
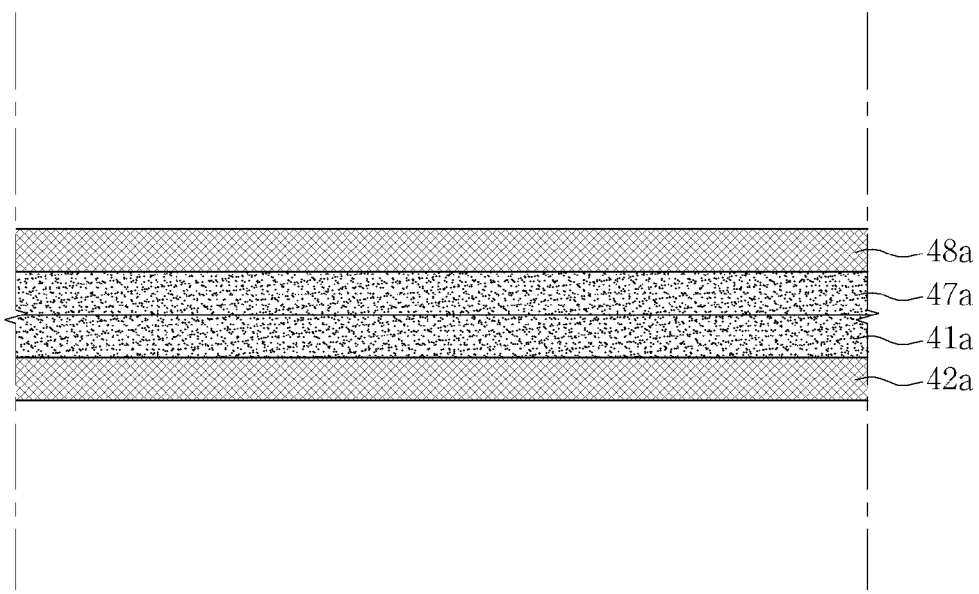

Referring to FIG. 8D, the method of forming the switching layer SWa in the embodiment of FIGS. 6A-D or 7A-D (at the stages shown in FIG. 6A or 7A, respectively) may include forming a lower anode electrode material layer 42a, a lower cathode electrode material layer 41a, an upper cathode electrode material layer 47a, and an upper anode electrode material layer 48a.

The lower anode electrode material layer 42a and the upper anode electrode material layer 48a may comprise silicon doped with a group-III element such as boron (B), gallium (Ga), or indium (In).

The lower cathode electrode material layer 41a and the upper cathode electrode material layer 47a may comprise silicon doped with a group-V element such as phosphorous (P), arsenic (As), antimony (Sb), or bismuth (Bi).

The lower anode electrode material layer 42a may have a relatively high dopant concentration, for example, a peak dopant concentration of about (1E20 to 1E21)/cm$^3$.

The lower cathode electrode material layer 41a may have a relatively low dopant concentration, for example, a peak dopant concentration of about (1E16 to 1E17)/cm$^3$.

The upper cathode electrode material layer 47a may have a middle-range dopant concentration, for example, a peak dopant concentration of about (1E18 to 5E18)/cm$^3$.

The upper anode electrode material layer 48a may have a relatively high dopant concentration, for example, a peak dopant concentration of about (1E20 to 1E21)/cm$^3$, such as that of the lower anode electrode material layer 42a.

Then, the method may proceed to either of the processes described with reference to FIG. 6B or 7B.

Figure 9A:
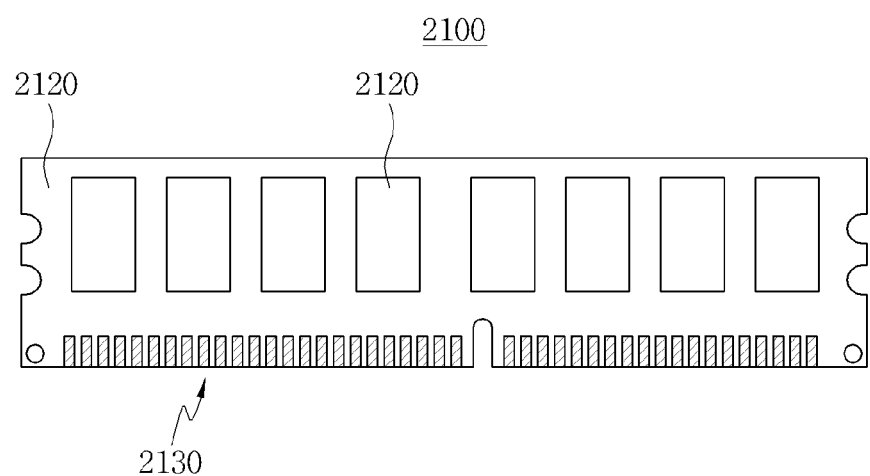
FIGS. 9A and 9B are views conceptually illustrating memory modules including at least one of the resistive memory devices in accordance with various embodiments of the inventive concept.

FIG. 9A illustrates a memory module 2100 including at least one of the resistive memory devices, in accordance with the inventive concept. Referring to 9A, the memory module 2100 may include a module substrate 2110, a plurality of memory devices 2120 disposed on the module substrate 2110, and a plurality of terminals 2130 arranged on a side of the module substrate 2110. The module substrate 2110 may include a printed circuit board (PCB). The memory devices 2120 may include one of the resistive memory devices in accordance with the inventive concept. The plurality of terminals 2130 may comprise a metal such as copper. The terminals may be electrically connected to each of the semiconductor devices 2120.

Figure 9B:
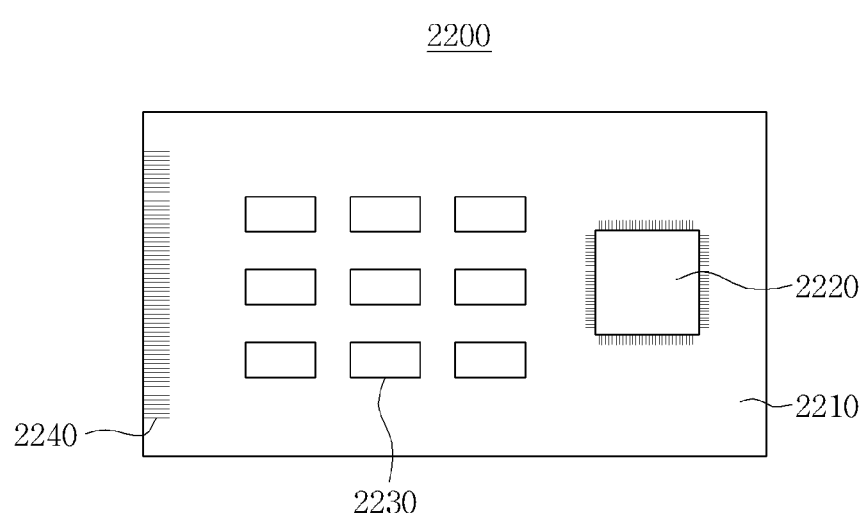

FIG. 9B illustrates a semiconductor module 2200 including at least one of the resistive memory devices, in accordance with the inventive concept. Referring to FIG. 9B, the semiconductor module 2200 may include a processor 2220 and semiconductor devices 2230, which are mounted on a module substrate 2210. The processor 220 or the semiconductor devices 2230 may include at least one of the resistive memory devices in accordance with the inventive concept. Conductive input/output terminals 2240 may be disposed on at least one side of the module substrate 2210.

Figure 9C:
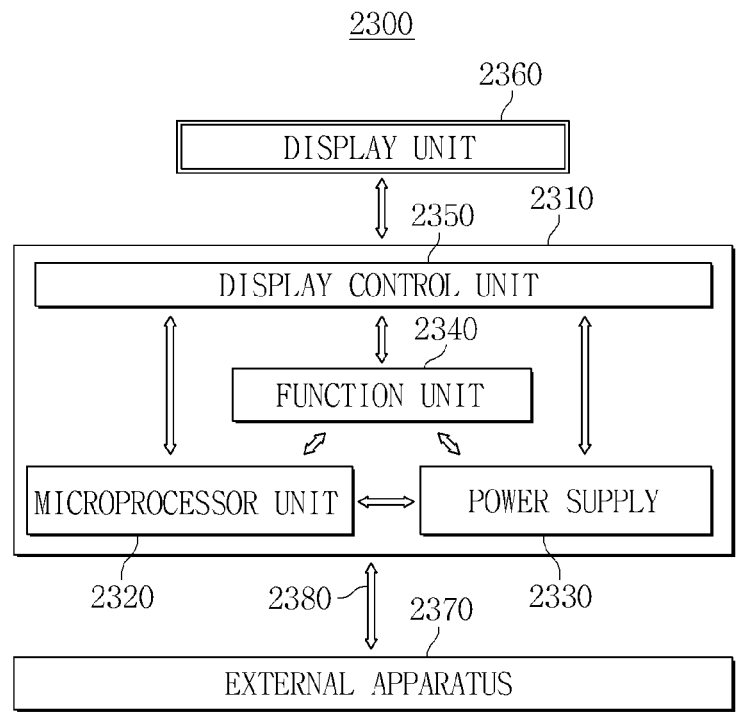
FIGS. 9C and 9D are block diagrams conceptually illustrating electronic systems including at least one of the resistive memory devices in accordance with various embodiments of the inventive concept.
Figure 9D:
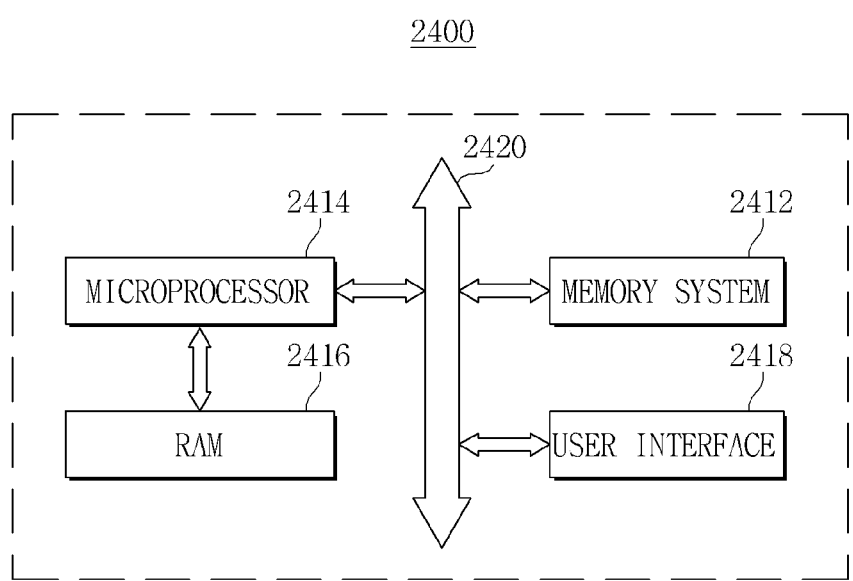

FIGS. 9C and 9D illustrate electronic systems in accordance with the inventive concept. Referring to FIG. 9C, an electronic system 2300 in accordance with the inventive concept may include a body 2310, a display unit 2360, and an external apparatus 2370. The body 2310 may include a microprocessor unit 2320, a power supply 2330, a function unit 2340, and/or a display control unit 2350. The body 2310 may include a system board or a motherboard having a PCB and the like, and/or a case. The microprocessor unit 2320, the power supply 2330, the function unit 2340, and the display control unit 2350 may be mounted or disposed on an upper surface of the body 2310 or inside the body 2310. The display unit 2360 may be disposed on the upper surface of the body 2310 or inside/outside the body 2310. The display unit 2360 may display an image processed by the display control unit 2350. For example, the display unit 2360 may include a liquid crystal display (LCD), active matrix organic light emitting diodes (AMOLED), or various other types of display panels. The display unit 2360 may include a touch screen. Therefore, the display unit 2360 may have an input/output function. The power supply 2330 may supply a current or voltage to the microprocessor unit 2320, the function unit 2340, the display control unit 2350, etc. The power supply 2330 may include a charging battery, a socket for a dry cell, or a voltage/current converter. The microprocessor unit 2320 may receive a voltage from the power supply 2330 to control the function unit 2340 and the display unit 2360. For example, the microprocessor unit 2320 may include a CPU or application processor (AP). The function unit 2340 may perform various functions. To these ends, for example, the function unit 2340 may include a touch pad, a touch screen, a volatile/non-volatile memory, a memory card controller, a camera, a light, an audio and moving picture reproducing processor, a wireless radio antenna, a speaker, a microphone, a USB port, or a unit having another function(s). The microprocessor unit 2320 and the function unit 2340 may include at least one of the resistive memory devices in accordance with the inventive concept.

Referring to FIG. 9D, an electronic system 2400 in accordance with the inventive concept may include a microprocessor 2414, a memory system 2412, and a user interface 2418 configured to perform data communication using a bus 2420. The microprocessor 2414 may include a CPU or AP. The electronic system 2400 may further include a RAM 2416 configured to directly communicate with the microprocessor 2414. The microprocessor 2414 and/or the RAM 2416 may be assembled within a single package. The user interface 2418 may be used to input data to the electronic system 2400, or output data from the electronic system 2400. For example, user interface 2418 may include a touch pad, a touch screen, a keyboard, a mouse, a voice detector, a cathode ray tube (CRT) monitor, an LCD, an AMOLED, a plasma display pad (PDP), a printer, a light, or various types of input/output devices. The memory system 2412 may store operating code of the microprocessor 2414, data processed by the microprocessor 2414, or data received from the outside. The memory system 2412 may include a memory controller, a hard disk, or a solid state drive (SSD). The microprocessor 2414, the RAM 2416, and/or the memory system 2412 may include at least one of the resistive memory devices in accordance with the inventive concept.

As described above, according to an aspect of the inventive concept there is provided a resistive memory device including a switching device having an asymmetric structure. Therefore, a leakage current can be minimized when the device is in a negative bias state. Accordingly, a read operation can be stable and power consumption can be minimized.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A resistive memory device, comprising:
   a lower interconnection extending in a first direction;
   an upper interconnection extending in a second direction perpendicular to the first direction; and
   a memory cell disposed at a location at which the lower interconnection crosses the upper interconnection,
   wherein the memory cell comprises:
   a switching device;
   a lower electrode disposed on the switching device;
   a resistor disposed on the lower electrode; and
   an upper electrode disposed on the resistor,
   wherein the switching device comprises:
   a lower diode having a lower cathode; and
   an upper diode disposed on the lower diode, and having an upper cathode, and
   wherein each of the upper cathode and the lower cathode comprise at least one layer of doped material, and
   the average dopant concentration of the upper cathode is greater than the average dopant concentration of the lower cathode.

2. The resistive memory device of claim 1, wherein the upper cathode comprises:
   a middle-concentration upper cathode electrode layer; and
   a high-concentration upper cathode electrode layer disposed on the middle-concentration upper cathode electrode layer, and having a higher dopant concentration than the middle-concentration upper cathode electrode layer.

3. The resistive memory device of claim 2, wherein the lower cathode comprises:
   a high-concentration lower cathode electrode layer having a relatively high dopant concentration; and
   a low-concentration lower cathode electrode layer disposed on the high-concentration lower cathode electrode layer, and having a dopant concentration smaller than that of the middle-concentration upper cathode electrode layer.

4. The resistive memory device of claim 3, wherein the high-concentration lower cathode electrode layer has a peak dopant concentration of about (1E20 to 1E21)/cm$^3$.

5. The resistive memory device of claim 3, wherein the low-concentration lower cathode electrode layer has a peak dopant concentration of about (1E16 to 1E17)/cm$^3$.

6. The resistive memory device of claim 3, wherein the high-concentration upper cathode electrode layer has a peak dopant concentration of about (1E20 to 1E21)/cm$^3$.

7. The resistive memory device of claim 3, wherein the middle-concentration upper cathode electrode layer has a peak dopant concentration of about (1E18 to 5E18)/cm$^3$.

8. The resistive memory device of claim 3, wherein the switching device further includes a common anode interposed between the low-concentration lower cathode electrode layer and the middle-concentration upper cathode electrode layer, and the lower diode and the upper diode share the common anode.

9. The resistive memory device of claim 8, wherein the common anode has a peak dopant concentration of about (1E18 to 5E18)/cm$^3$.

10. The resistive memory device of claim 8, wherein the high-concentration upper cathode electrode layer is electrically directly connected to the lower electrode.

11. The resistive memory device of claim 1, wherein the switching device further includes a diode electrode directly disposed on the lower interconnection, and the diode electrode and the lower electrode are of the same metal.

12. The resistive memory device of claim 11, further comprising:
a lower buffer between the diode electrode and the lower cathode; and
an upper buffer between the lower electrode and the upper cathode.

13. The resistive memory device of claim 1, further comprising:
a filling insulating layer on side surfaces of the memory cell.

14. A resistive memory device, comprising:
a lower interconnection;
a switching device disposed on the lower interconnection;
a resistor element disposed on the switching device; and
an upper interconnection disposed on the resistor element,
wherein the switching device comprises:
a lower diode having a lower cathode and a lower anode; and
an upper diode having an upper cathode and an upper anode, and
wherein the lower diode and the upper diode contain dopants, and
the distribution of the dopant concentration of the lower diode and the distribution of dopant concentration of the upper diode, each in a vertical direction, are asymmetric with respect to a horizontal plane disposed midway between the upper and lower diodes.

15. The resistive memory device of claim 14, wherein the lower anode is disposed on the lower cathode, the upper anode is disposed on the lower anode, and the upper cathode is disposed on the upper anode, and the peak dopant concentration of the upper anode is at least 10 times the peak dopant concentration of the lower anode.

16. The resistive memory device of claim 15, wherein the peak dopant concentration of the lower cathode and the peak dopant concentration of the upper cathode are each at least 10 times the peak dopant concentration of the upper anode.

17. The resistive memory device of claim 14, wherein the lower cathode is disposed on the lower anode, the upper cathode is disposed on the lower cathode, and the upper anode is disposed on the upper cathode, and the peak dopant concentration of the lower cathode is at least 10 times the peak dopant concentration of the upper cathode.

18. A memory device, comprising:
a first line, and a second line that crosses over the first line; and
a switch and a resistor disposed in series between the first and second lines,
the switch including a stack of electrode layers, and
wherein the electrode layers comprise first and second pairs of electrode layers,
wherein the electrode layers of the first pair are disposed symmetrically with respect to one another in the stack about a plane perpendicular to the direction in which the electrodes are stacked, and
the electrode layers of the first pair are of the same type of material and contain the same type of dopant,
wherein the electrode layers of the second pair are disposed symmetrically with respect to one another in the stack about a plane perpendicular to the direction in which the electrodes are stacked, and
the electrode layers of the second pair are of the same type of material and contain the same type of dopant, the average dopant concentrations of the electrode layers of the second pair are substantially different from one another, and the average dopant concentration of each of the electrode layers of the second pair is substantially lower than the average dopant concentration of each of the electrode layers of the first pair,
wherein the electrode layers constitute a lower diode and an upper diode.

19. The memory device of claim 18, wherein the lower diode comprises an anode and a cathode, and the upper diode comprises an anode and a cathode, and
the anodes or the cathodes are constituted by the first and second pairs of the electrode layers.

20. The memory device of claim 19, wherein the electrode layers of the first pair have the substantially the same average dopant concentrations.

* * * * *